US012745551B2

(12) United States Patent
Tong et al.

(10) Patent No.: US 12,745,551 B2
(45) Date of Patent: Sep. 22, 2026

(54) DISPLAY PANEL, METHOD FOR MANUFACTURING SAME, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Kemeng Tong, Beijing (CN); Cong Fan, Beijing (CN); Yu Wang, Beijing (CN); Fan He, Beijing (CN); Bo Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 619 days.

(21) Appl. No.: 17/766,785

(22) PCT Filed: Mar. 4, 2021

(86) PCT No.: PCT/CN2021/079078

§ 371 (c)(1),
(2) Date: Apr. 6, 2022

(87) PCT Pub. No.: WO2022/183434

PCT Pub. Date: Sep. 9, 2022

(65) Prior Publication Data

US 2023/0200156 A1 Jun. 22, 2023

(51) Int. Cl.
*H10K 59/88* (2023.01)
*G06F 3/041* (2006.01)
(Continued)

(52) U.S. Cl.
CPC .......... *H10K 59/88* (2023.02); *G06F 3/0412* (2013.01); *G06F 3/04164* (2019.05);
(Continued)

(58) Field of Classification Search
None
See application file for complete search history.

(56) References Cited

U.S. PATENT DOCUMENTS 12,317,708 B2 * 5/2025 Lhee .................... H10K 59/131
2004/0036072 A1 2/2004 Tsujimura et al.
(Continued)

FOREIGN PATENT DOCUMENTS

CN 103885223 A 6/2014
CN 103941495 A 7/2014
(Continued)

OTHER PUBLICATIONS

Extended European search report of counterpart European application No. 21928519.4 issued on Jun. 9, 2023.

*Primary Examiner* — Steven B Gauthier
*Assistant Examiner* — E. Rhett Cheek
(74) *Attorney, Agent, or Firm* — Lippes Mathias LLP

(57) ABSTRACT

Provided is a display panel, including: a substrate, including a display region and a non-display region disposed on an outer periphery of the display region; a light-emitting device and a packaging layer, disposed on the substrate; and at least one retaining wall and a signal trace, disposed on a side of the packaging laver proximate to the substrate; wherein the light-emitting device is disposed within the display region, the at least one retaining wall and the signal trace are disposed within the non-display region, and the signal trace is electrically connected to the light-emitting device and is provided with an aperture, wherein an orthographic projection of the aperture on the substrate is disposed within an
(Continued)

000 orthographic projection of the at least one retaining wall on the substrate.

17 Claims, 3 Drawing Sheets

(51) Int. Cl.

| | |
|---|---|
| ***G06F 3/044*** | (2006.01) |
| ***H10K 59/12*** | (2023.01) |
| ***H10K 59/131*** | (2023.01) |
| ***H10K 59/179*** | (2023.01) |
| ***H10K 59/40*** | (2023.01) |
| ***H10K 59/80*** | (2023.01) |

(52) U.S. Cl.

CPC ....... *G06F 3/0446* (2019.05); *H10K 59/1201* (2023.02); *H10K 59/131* (2023.02); *H10K 59/179* (2023.02); *H10K 59/40* (2023.02); *H10K 59/873* (2023.02); *H10K 59/8731* (2023.02); *G06F 2203/04107* (2013.01); *G06F 2203/04111* (2013.01); *H10K 59/87* (2023.02)

(56) References Cited

U.S. PATENT DOCUMENTS

| | | | | |
|---|---|---|---|---|
| 2012/0327032 | A1 | 12/2012 | Jeon et al. | |
| 2014/0176494 | A1 | 6/2014 | Huang | |
| 2016/0011705 | A1 | 1/2016 | Huang | |
| 2017/0221975 | A1 | 8/2017 | Lee et al. | |
| 2018/0095581 | A1* | 4/2018 | Hwang | H10K 59/8731 |
| 2018/0337226 | A1* | 11/2018 | Liu | H10K 50/81 |
| 2019/0129567 | A1* | 5/2019 | Rhe | G06F 3/0446 |
| 2020/0019294 | A1* | 1/2020 | Lee | G06F 3/0448 |
| 2020/0301535 | A1* | 9/2020 | Choi | H10K 59/40 |
| 2020/0381653 | A1* | 12/2020 | Bang | H10K 50/844 |
| 2021/0408068 | A1 | 12/2021 | Xiao et al. | |
| 2021/0408081 | A1 | 12/2021 | Liu et al. | |
| 2021/0408462 | A1 | 12/2021 | Tang | |
| 2022/0019304 | A1 | 1/2022 | Liu et al. | |
| 2022/0102468 | A1* | 3/2022 | Lee | H10K 77/111 |
| 2022/0115488 | A1* | 4/2022 | Shin | H10K 59/121 |
| 2022/0216288 | A1* | 7/2022 | Okabe | H05B 33/04 |
| 2023/0195267 | A1* | 6/2023 | Tan | G06F 3/0443 345/174 |
| 2025/0185490 | A1* | 6/2025 | Hirai | H05B 33/12 |
| 2025/0377744 | A1* | 12/2025 | Bang | G06F 3/0412 |

FOREIGN PATENT DOCUMENTS

| | | | |
|---|---|---|---|
| CN | 105514119 | A | 4/2016 |
| CN | 108598087 | A | 9/2018 |
| CN | 207852679 | U | 9/2018 |
| CN | 209641657 | U | 11/2019 |
| CN | 110634888 | A | 12/2019 |
| CN | 110718565 | A | 1/2020 |
| CN | 110854161 | A | 2/2020 |
| CN | 111710712 | A | 9/2020 |
| CN | 111796721 | A | 10/2020 |
| CN | 111812888 | A | 10/2020 |
| EP | 1814181 | A2 | 8/2007 |
| EP | 3522229 | A1 | 8/2019 |
| EP | 3660919 | A2 | 6/2020 |
| KR | 20190077870 | A | 7/2019 |

* cited by examiner

DISPLAY PANEL, METHOD FOR MANUFACTURING SAME, AND DISPLAY DEVICE

CROSS-REFERENCE TO RELATED APPLICATION

This application is a 371 of PCT application No. PCT/CN2021/079078, filed on Mar. 4, 2021, the disclosure of which is incorporated herein by reference in its entirety.

TECHNICAL FIELD

The present disclosure relates to the field of display technologies, in particular, relates to a display panel, a method for manufacturing the same, and a display device.

BACKGROUND

With the development of display technologies, display devices are used more and more widely. Common display devices include smartphones, tablet computers, televisions, monitors, and the like.

A display panel may generally include: a substrate, a light-emitting device and a packaging layer that are disposed on the substrate, and a retaining wall and a signal trace that are disposed on a side of the packaging layer proximate to the substrate. The packaging layer may include a first inorganic packaging layer, an organic packaging layer, and a second inorganic packaging layer that are laminated. The packaging layer is configured to encapsulate the light-emitting device, and isolate the light-emitting device from the outside air, such that the light-emitting layer in the light-emitting device is prevented from being eroded by, for example, moisture and oxygen in the air. The retaining wall is disposed within a non-display region of the display panel and consists of an organic film layer in the display panel. The retaining wall may be configured to block the organic packaging layer in the packaging layer, such that the orthographic projection of the organic packaging layer of the packaging layer on the substrate is within the display region. As a result, the organic packaging layer in the packaging layer is less likely to absorb moisture in the non-display region, thereby reducing the possibility to affect the packaging effect of the packaging layer.

However, at the retaining wall, the organic film layer, which is prone to absorb moisture, is provided in the display panel on a side of the signal trace proximate to the substrate. Therefore, the signal trace in the display panel has poor flatness at the retaining wall, which in turn affects the electrical signals loaded on the signal trace, and thereby causes the display panel to have a poor effect.

SUMMARY

Embodiments of the present disclosure provide a display panel, a manufacturing method for the same, and a display device. The problem that the display panel in the related art has a poor effect may be solved, and the technical solutions are as follows.

According to a first aspect of the embodiments of the present disclosure, a display panel is provided. The display panel includes:

- a substrate, including a display region and a non-display region disposed on an outer periphery of the display region;
- a light-emitting device and a packaging layer, disposed on the substrate; and
- at least one retaining wall and a signal trace, disposed on a side of the packaging layer proximate to the substrate;
- wherein the light-emitting device is disposed within the display region, the at least one retaining wall and the signal trace are disposed within the non-display region, and the signal trace is electrically connected to the light-emitting device and is provided with an aperture, wherein an orthographic projection of the aperture on the substrate is within an orthographic projection of the at least one retaining wall on the substrate.

In some embodiments, the light-emitting device includes an anode, a light-emitting layer, and a cathode that are laminated; and the signal trace includes a first power signal lead electrically connected to the cathode and a second power signal lead electrically connected to the anode, wherein the aperture is disposed within the first power signal lead and/or the second power signal lead.

In some embodiments, the display panel further includes: a touch unit and a touch signal lead, disposed on a side of the packaging layer distal from the substrate, wherein the touch signal lead is connected to the touch unit;

- wherein the touch unit is disposed within the display region, the touch signal lead is disposed within the non-display region, and an orthographic projection of the touch signal lead on the substrate is at least partially within an orthographic projection of the first power signal lead on the substrate, and is not overlapped with the orthographic projection of the aperture on the substrate.

In some embodiments, a plurality of touch signal leads are arranged, wherein at least one aperture is arranged between at least two adjacent touch signal leads.

In some embodiments, a plurality of apertures are arranged in the first power signal lead, wherein at least one aperture is arranged between any two adjacent touch signal leads.

In some embodiments, a distance between any two adjacent touch signal leads is greater than a width of the aperture, and a width direction of the aperture is perpendicular to an extending direction of the touch signal lead.

In some embodiments, two first power signal leads are arranged, and a plurality of the touch signal leads are divided into two groups of touch signal leads, wherein the two first power signal leads correspond to the two groups of touch signal leads one by one, and an orthographic projection of each group of the touch signal leads on the substrate is at least partially within an orthographic projection of a corresponding first power signal lead on the substrate.

In some embodiments, a group of the touch signal leads includes a plurality of first touch signal leads successively arranged, and another group of the touch signal leads includes a plurality of second touch signal leads successively arranged; and the touch unit includes a touch sensing electrode and a touch driving electrode that are insulated from each other, wherein the first touch signal lead is connected to the touch sensing electrode, and the second touch signal lead is connected to the touch driving electrode.

In some embodiments, the touch signal lead includes a first sub-lead and a second sub-lead electrically connected to the first sub-lead, wherein the first sub-lead and the second sub-lead are disposed on different layers.

In some embodiments, an orthographic projection of the first sub-lead on the substrate is overlapped with an orthographic projection of the second sub-lead on the substrate.

In some embodiments, the display panel further includes a first conductive layer, an insulating layer, and a second conductive layer that are disposed on the packaging layer and laminated in a direction perpendicular to and distal from the packaging layer;

wherein the first conductive layer includes the first sub-lead, the second conductive layer includes the second sub-lead, the touch sensing electrode, and the touch driving electrode, and the insulating layer is provided with a first via hole, wherein the first sub-lead is electrically connected to the second sub-lead via the first via hole.

In some embodiments, a plurality of touch driving electrodes are arranged in a plurality of rows, the first conductive layer further includes a plurality of connecting bridges, and the insulating layer further is provided with a second via hole, wherein each of the plurality of connecting bridges is connected to two adjacent touch driving electrodes in a same row via the second via hole; and a plurality of touch sensing electrodes are arranged in a plurality of columns, and the second conductive layer further includes a plurality of connecting electrodes, wherein each of the plurality of connecting electrodes is connected to two adjacent touch sensing electrodes in a same column.

In some embodiments, the display panel further includes a touch signal line configured to connect the touch unit and the touch signal lead;

wherein orthographic projections of the touch unit and the touch signal lead on the substrate are both within an orthographic projection of the cathode on the substrate.

In some embodiments, the signal trace further includes a power connecting bus electrically connected to the second power signal lead, wherein the aperture is further disposed within the power connecting bus; and the display panel further includes a power signal line disposed within the display region, wherein the power connecting bus is connected to the power signal line and the second power signal lead, respectively.

In some embodiments, two first power signal leads and two second power signal leads are arranged, wherein the two second power signal leads are disposed between the two first power signal leads; and the display panel further includes a plurality of driving signal lines disposed within the display region, and a plurality of driving signal leads disposed within the non-display region, wherein the plurality of driving signal lines are connected to the plurality of driving signal leads in one-to-one correspondence, and the plurality of driving signal leads are disposed between the two second power signal leads.

In some embodiments, the first power signal lead, the power connecting bus and the second power signal lead are disposed on a same layer and are made of a same material, and the first power signal lead and the driving signal lead are disposed on different layers.

In some embodiments, each of the retaining walls includes at least two organic insulating layers that are laminated, and the display panel further includes a third conductive layer between two adjacent organic insulating layers in the at least one retaining wall, wherein the third conductive layer includes the signal trace.

In some embodiments, the at least one retaining wall includes a first retaining wall and a second retaining wall, wherein the second retaining wall is proximate to the display region relative to the first retaining wall;

at least two organic insulating layers in the first retaining wall include a first organic insulating layer, a second organic insulating layer, and a pixel defining layer that are laminated;

at least two organic insulating layers in the second retaining wall include the second organic insulating layer and the pixel defining layer that are laminated; and the third conductive layer is disposed between the first organic insulating layer and the second organic insulating layer, and the orthographic projection of the aperture on the substrate is within an orthographic projection of the first retaining wall on the substrate.

According to a second aspect of the embodiments of the present disclosure, a method for manufacturing a display panel is provided. The method includes:

providing a substrate, wherein the substrate includes a display region and a non-display region disposed on an outer periphery of the display region; and forming a light-emitting device, a packaging layer, at least one retaining wall, and a signal trace on the substrate;

wherein the light-emitting device is disposed within the display region, the at least one retaining wall and the signal trace are disposed within the non-display region, and the signal trace is electrically connected to the light-emitting device and is provided with an aperture, wherein an orthographic projection of the aperture on the substrate is within an orthographic projection of the at least one retaining wall on the substrate.

According to a third aspect of the embodiments of the present disclosure, a display device is provided. The display device includes:

the display panel as described above and a driving chip;

wherein the driving chip is electrically connected to the signal trace in the display panel.

The technical solutions according to the embodiments of the present disclosure at least achieve following beneficial effects.

The display panel includes a substrate, a light-emitting device, a packaging layer, at least one retaining wall, and a signal trace. In the display panel, the signal trace is provided with an aperture, and an orthographic projection of the aperture on the substrate is within an orthographic projection of the at least one retaining wall of the display panel on the substrate. Therefore, at the at least one retaining wall, the moisture absorbed by the organic film layer as disposed on a side of the signal trace proximate to the substrate is released via the aperture, such that the flatness of the signal trace is ensured, the impact on electrical signals loaded on the signal trace is reduced.

In this way, the display effect of the display panel is improved.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

In order to make the object, technical solutions and advantages of the present disclosure clearer, the embodiments of the present disclosure will be described in detail hereinafter with reference to the accompanying drawings.

Figure 1:
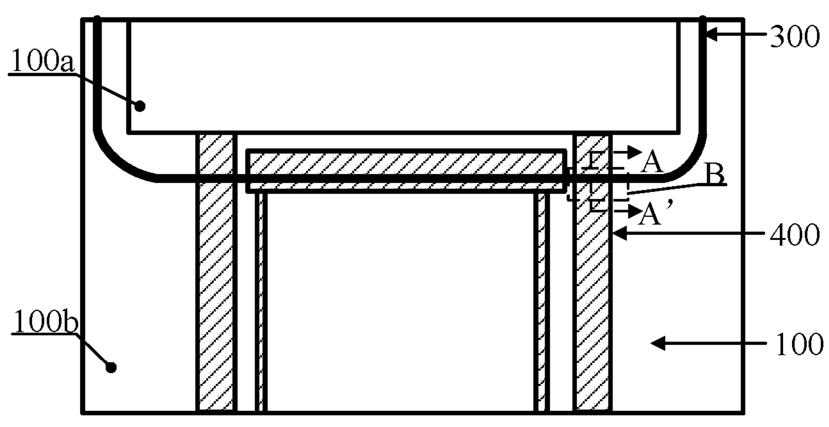
FIG. 1 is a schematic structural diagram of a display panel according to an embodiment of the present disclosure.
Figure 2:
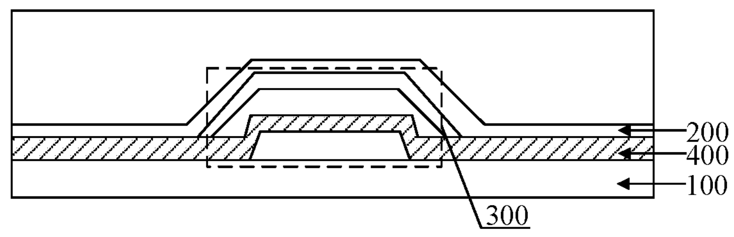
FIG. 2 is a cross-sectional view of the display panel shown in FIG. 1 at A-A'.
Figure 3:
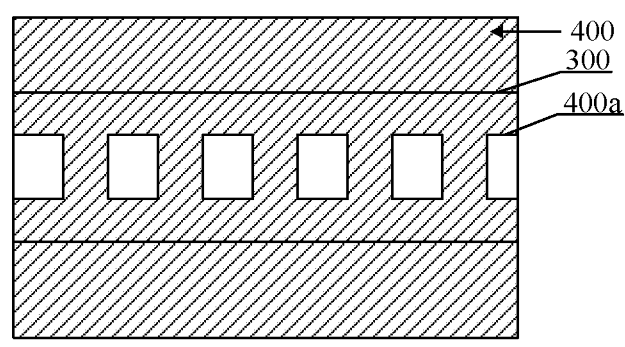
FIG. 3 is a partial enlarged view of the display panel shown in FIG. 1 at B.

Referring to FIG. 1, FIG. 2 and FIG. 3, FIG. 1 is a schematic structural diagram of a display panel according to an embodiment of the present disclosure, FIG. 2 is a cross-sectional view of the display panel shown in FIG. 1 at A-A', and FIG. 3 is a partial enlarged view of the display panel shown in FIG. 1 at B. The display panel 000 may include a substrate 100. The substrate 100 includes a display region 100*a* and a non-display region 100*b* on an outer periphery of the display region 100*a*.

The display panel 000 may further include: a light-emitting device (not shown in the drawings) and a packaging layer 200 that are disposed on the substrate 100, and at least one retaining wall 300 and a signal trace 400 that are disposed on a side of the packaging layer 200 proximate to the substrate 100.

The light-emitting device is disposed within the display region 100*a*. The at least one retaining wall 300 and the signal trace 400 are both disposed within the non-display region 100*b*, and the signal trace 400 is electrically connected to the light-emitting device. The signal trace 400 is provided with an aperture 400*a*, and an orthographic projection of the aperture 400*a* on the substrate 100 is within an orthographic projection of the at least one retaining wall 300 on the substrate. The signal trace 400 is configured to provide power signals to the light-emitting device.

In the present disclosure, the signal trace 400 in the display panel 000 is provided with an aperture 400*a*, and an orthographic projection of the aperture 400*a* on the substrate 100 is within an orthographic projection of the at least one retaining wall 300 of the display panel 000 on the substrate 100. Therefore, at the at least one retaining wall 300, the moisture absorbed by the organic film layer as disposed on a side of the signal trace 400 proximate to the substrate 100 is released via the aperture 400*a*, which ensures flatness of the signal trace 400. In this way, the impact on electrical signals loaded on the signal trace 400 is reduced, and the display effect of the display panel 000 is improved.

In summary, the display panel according to embodiments of the present disclosure includes a substrate, a light-emitting device, a packaging layer, at least one retaining wall, and a signal trace. In the display panel, the signal trace is provided with an aperture, and an orthographic projection of the aperture on the substrate is within an orthographic projection of the at least one retaining wall of the display panel on the substrate. Therefore, at the at least one retaining wall, the moisture absorbed by the organic film layer as disposed on a side of the signal trace proximate to the substrate is released via the aperture, which ensures flatness of the signal trace. In this way, the impact on electrical signals loaded on the signal trace is reduced, and the display effect of the display panel is improved.

Figure 4:
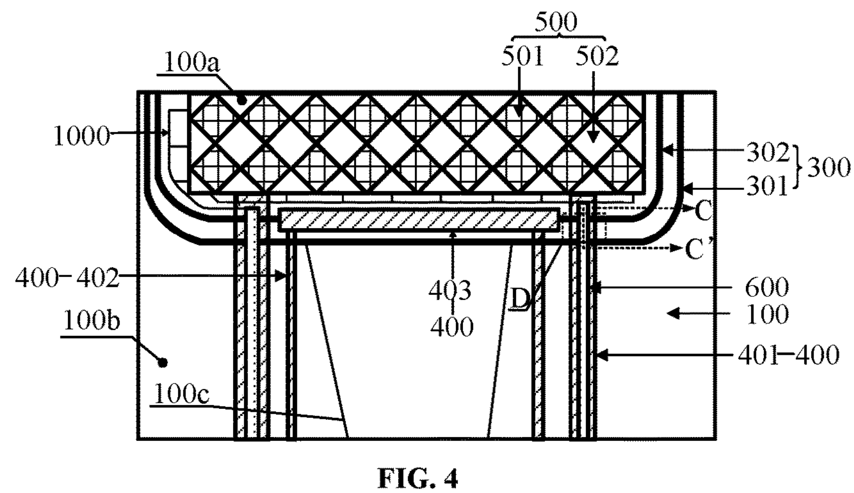
FIG. 4 is a schematic structural diagram of another display panel according to an embodiment of the present disclosure.
Figure 5:
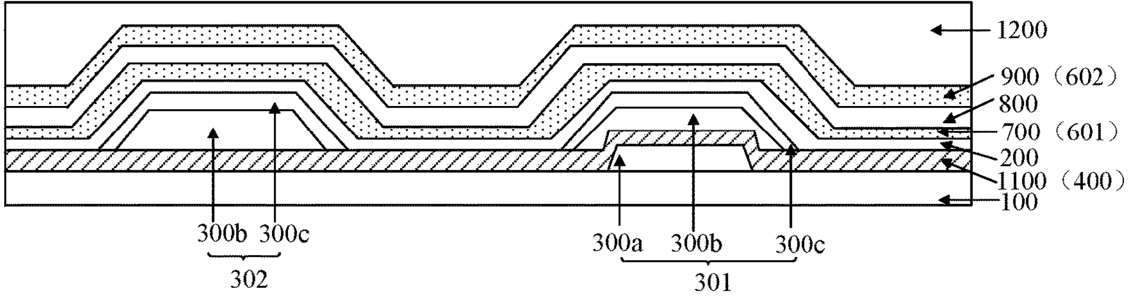
FIG. 5 is a cross-sectional view of the display panel shown in FIG. 4 at C-C'.
Figure 6:
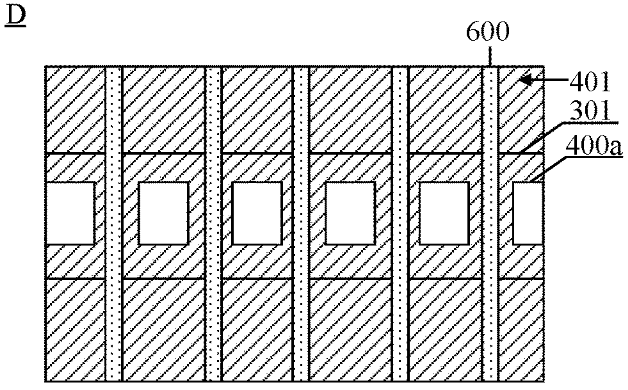
FIG. 6 is a partial enlarged view of the display panel shown in FIG. 5 at D.

In embodiments of the present disclosure, referring to FIG. 4, FIG. 5 and FIG. 6, FIG. 4 is a schematic structural diagram of another display panel according to an embodiment of the present disclosure, FIG. 5 is a cross-sectional view of the display panel shown in FIG. 4 at C-C', and FIG. 6 is a partial enlarged view of the display panel shown in FIG. 5 at D. The light-emitting device in the display panel 000 may include an anode, a light-emitting layer and a cathode that are laminated. The signal trace 400 may include a first power signal lead 401 electrically connected to the cathode, and a second power signal lead 402 electrically connected to the anode.

In the present disclosure, the positional relationship between the aperture 400*a* and the first power signal lead 401 and second power signal lead 402 may be practiced by various means, and embodiments of the present disclosure are schematically illustrated by taking following three possible embodiments as an example.

In a first possible embodiment, the aperture 400*a* is disposed within the first power signal lead 401 and the second power signal lead 402. In an exemplary embodiment, the orthographic projection of the first power signal lead 401 on the substrate 100 includes a first overlap region with the orthographic projection of the at least one retaining wall 300 on the substrate 100, and the orthographic projection of the aperture 400*a* in the first power signal lead 401 on the substrate 100 is within the first overlap region. The orthographic projection of the second power signal lead 402 on the substrate 100 includes a second overlap region with the orthographic projection of the at least one retaining wall 300 on the substrate 100, and the orthographic projection of the aperture 400*a* in the second power signal lead 402 on the substrate 100 is within the second overlap region. As a result, the flatness of the first power signal lead 401 and second power signal lead 402 at the at least one retaining wall 300 is ensured.

In a second possible embodiment, the aperture 400*a* is disposed within the first power signal lead 401. In an exemplary embodiment, the orthographic projection of the first power signal lead 401 on the substrate 100 includes a first overlap region with the orthographic projection of the at least one retaining wall 300 on the substrate 100, and the orthographic projection of the aperture 400*a* in the first power signal lead 401 on the substrate 100 is within the first overlap region. As a result, the flatness of the first power signal lead 401 at the at least one retaining wall 300 is ensured.

In a third possible embodiment, the aperture 400*a* is disposed within the second power signal lead 402. In an exemplary embodiment, the orthographic projection of the second power signal lead 402 on the substrate 100 includes a second overlap region with the orthographic projection of the at least one retaining wall 300 on the substrate 100, and the orthographic projection of the aperture 400*a* in the second power signal lead 402 on the substrate 100 is within the second overlap region. As a result, the flatness of the second power signal lead 402 at the at least one retaining wall 300 is ensured.

It should be noted that, the first power signal lead 401 may be loaded with a constant low-level voltage. For example, the first power signal lead 401 may be loaded with a VSS signal, and the first power signal lead 401 may be referred to as a VSS signal lead. The second power signal lead 402 may be loaded with a constant high-level voltage. For example, the second power signal lead 402 may be loaded with a VDD signal, and the second power signal lead 402 may be referred to as a VDD signal lead.

It should be noted that, the following embodiments of the present disclosure are schematically illustrated by taking an example in which the aperture 400*a* is disposed within the first power signal lead 401, or within the first power signal lead 401 and the second power signal lead 402.

In embodiments of the present disclosure, the signal trace 400 may further include a power connecting bus 403 electrically connected to the second power signal lead 402, and the aperture 400*a* may be disposed within the power connecting bus 403. In an exemplary embodiment, the orthographic projection of the power connecting bus 403 on the substrate 100 includes a third overlap region with the orthographic projection of the at least one retaining wall 300 on the substrate 100, and the orthographic projection of the aperture 400*a* in the power connecting bus 403 on the substrate 100 is within the third overlap region. As a result, the flatness of the power connecting bus 403 at the at least one retaining wall 300 is ensured. The display panel 000 may further include a power signal line (not shown in the figures) in the display region 100*a*. The power connecting bus 403 is electrically connected to each power signal line and each second power signal lead 402, respectively. As a result, the driving chip in the display device manufactured with the display panel 000 can load high-level voltage on the power signal line in the display region 100*a* via the second power signal lead 402 and the power connecting bus 403.

In the present disclosure, referring to FIG. 4, the display panel 000 may further include a touch unit 500 and a touch signal lead 600, disposed on a side of the packaging layer 200 distal from the substrate 100, and the touch signal lead 600 is connected to the touch unit 500. The touch unit 500 is disposed in the display region 100*a*, and the touch signal lead 600 is disposed in the non-display region 100*b*. An orthographic projection of the touch signal lead 600 on the substrate 100 is at least partially within the orthographic projection of the first power signal lead 401 on the substrate 100, and is not overlapped with the orthographic projection of the aperture 400*a* on the substrate 100. The first power signal lead 401 is loaded with a constant low-level voltage. Therefore, in the case that the orthographic projection of the touch signal lead 600 on the substrate 100 is at least partially within the orthographic projection of the first power signal lead 401 on the substrate 100, and is not overlapped with the orthographic projection of the aperture 400*a* on the substrate 100, such that the first power signal lead 401 may shield the touch signal lead 600, and thereby prevent generating parasitic capacitance between the touch signal lead 600 and the signal lead as disposed on a side of the first power signal lead 401 proximate to the substrate 100 in the display panel 000. In this way, the probability of crosstalk between the signals loaded on the touch signal lead 600 and the signals loaded on the signal lead is reduced, and the display effect of the display panel 000 is improved.

In embodiments of the present disclosure, there may be a plurality of touch signal leads 600 in the display panel 000, and at least one aperture 400*a* is arranged between at least two adjacent touch signal leads 600.

In an exemplary embodiment, there may be a plurality of apertures 400*a* in the first power signal lead 401 of the display panel 000, and at least one aperture 400*a* is arranged between any two adjacent touch signal leads 600. As a result, the touch signal lead 600 is arranged alternately with the aperture 400*a*. It should be noted that, in the case that the plurality of apertures 400*a* are arranged between any two adjacent touch signal leads 600, the plurality of apertures 400*a* are arranged in a direction perpendicular to the extending direction of the touch signal lead 600.

In some embodiments, the distance between any two adjacent touch signal leads 600 in the display panel 000 is greater than the width of the aperture 400*a*. The width direction of the aperture 400*a* is perpendicular to the extending direction of the touch signal lead 600. As a result, the shielding effect of the first power signal lead 401 on the touch signal lead 600 is ensured, and the probability of crosstalk between the signals loaded on the touch signal lead 600 and the signals loaded on the signal lead is prevented, thereby further improving the display effect of the display panel 000.

In an exemplary embodiment, the width of the aperture 400*a* may range from 12 to 18 μm within a range of a process error.

In the present disclosure, as shown in FIG. 4, there may be two first power signal leads 401, and touch signal lead 600*s* are divided into two groups of touch signal leads 600. The two first power signal leads 401 correspond to the two groups of touch signal leads 600 one by one. Moreover, an orthographic projection of each group of touch signal leads 600 on the substrate 100 is at least partially within the orthographic projection of a corresponding first power signal lead 401 on the substrate 100.

In an exemplary embodiment, one group of touch signal leads 600 may include a plurality of first touch signal leads successively arranged, and the other group of touch signal leads 600 may include a plurality of second touch signal leads successively arranged. The touch unit 500 in the display panel 000 may include a touch sensing electrode 501 and a touch driving electrode 502 that are insulated from each other. The first touch signal lead is connected to the touch sensing electrode 501, and the second touch signal lead is connected to the touch driving electrode 502. As a result, the first touch signal lead is loaded with a touch sensing signal and the second touch signal lead is loaded with a touch driving signal.

For example, there may be a plurality of touch sensing electrodes 501 and a plurality of touch driving electrodes 502 in the display panel 000. The plurality of touch sensing electrodes 501 may be arranged in a plurality of columns, and the plurality of columns of touch sensing electrodes 501 correspond to the first touch signal lead one by one. The plurality of touch driving electrodes 502 may be arranged in a plurality of rows, and the plurality of rows of touch driving electrodes 502 correspond to the second touch signal lead one by one.

In embodiments of the present disclosure, as shown in FIGS. 5 and 6, the touch signal lead 600 may include: a first sub-lead 601, and a second sub-lead 602 electrically connected to the first sub-lead 601. The first sub-lead 601 and the second sub-lead 602 are disposed on different layers, such that the cross-sectional area of the touch signal lead 600 is increased and the resistance of the touch signal lead 600 is thereby reduced.

In some embodiments, the orthographic projection of the first sub-lead 601 on the substrate 100 is overlapped with the orthographic projection of the second sub-lead 602 on the substrate 100. As a result, the width of the touch signal lead 600 is reduced, such that the distance between adjacent touch signal leads 600 is increased, and the difficulty in manufacturing the touch signal lead 600 is reduced.

In embodiments of the present disclosure, referring to FIG. 5, the display panel 000 may further include: a first conductive layer 700, an insulating layer 800 and a second conductive layer 900, which are disposed on the packaging layer 200, and laminated in a direction perpendicular to and distal from the packaging layer 200. The first conductive layer 700 may include a first sub-lead 601. The second conductive layer 900 may include a second sub-lead 602, a touch sensing electrode 501, and a touch driving electrode 502. The insulating layer 800 is provided with a first via hole (not shown in the figures), and the first sub-lead 601 and the second sub-lead 602 are electrically connected via the first via hole. In this case, the second sub-lead 602, the touch sensing electrode 501 and the touch driving electrode 502 may be formed by a same one-time patterning process, such that the manufacturing process of the display panel 000 is effectively simplified, and the manufacturing cost of the display panel 000 is reduced.

In some embodiments, in the display panel 000, there may be a plurality of touch driving electrodes 502, and the plurality of touch driving electrodes 502 may be arranged in a plurality of rows. The first conductive layer 700 may further include a plurality of connecting bridges (not shown in the figures). The insulating layer 800 further includes a second via hole (not shown in the figures). Each of the plurality of connecting bridges may be connected to two adjacent touch driving electrodes 502 in a same row via the second via hole. As a result, the touch driving electrodes 502 are electrically connected, such that the touch driving electrode 502 as connected electrically is capable of detecting a touch position. In this case, the connecting bridge and the first sub-lead 601 may be formed by a same one-time patterning process, such that the manufacturing process of the display panel 000 is further simplified, and the manufacturing cost of the display panel 000 is reduced.

In the display panel 000, a plurality of touch sensing electrodes 501 may be provided, wherein the plurality of touch sensing electrodes 501 are arranged in a plurality of columns. The second conductive layer 900 may further include a plurality of connecting electrodes (not shown in the figures). Each of the plurality of connecting electrodes is connected to two adjacent touch sensing electrodes 501 in a same column. As a result, an electrical connection between the touch sensing electrodes 501 is realized, such that the touch sensing electrodes 501 as connected electrically is configured to sense a touch position. In this case, the connecting electrode and the second sub-lead 602, and the touch sensing electrode 501 and the touch driving electrode 502 may be formed by a same one-time patterning process, such that the manufacturing process of the display panel 000 is further simplified, and the manufacturing cost of the display panel is reduced.

In an exemplary embodiment, as shown in FIG. 4, the touch sensing electrode 501 and the touch driving electrode 502 may be in a shape of a diamond plate, or may be in other shapes, which is not limited in embodiments of the present disclosure.

In the present disclosure, as shown in FIG. 4, the display panel 000 may further include a touch signal line 1000 for connecting the touch unit 500 and the touch signal lead 600. The orthographic projections of the touch unit 500 and touch signal line 1000 on the substrate 100 are both within the orthographic projection of the cathode in the light-emitting device on the substrate 100, and the cathode is connected to the first power signal lead 401. Since the cathode is connected to the first power signal lead 401, the cathode is also loaded with a constant first power signal. As a result, the cathode may function to shield the touch unit 500 and the touch signal line 1000, and prevent generating the crosstalk between the signals loaded on the touch unit 500 and touch signal line 1000 and the signals loaded on the signal line as disposed on a side of the cathode proximate to the substrate 100 in the display panel 000. In this way, the display effect of the display panel 000 is further improved.

In some embodiments, there may be a plurality of touch signal lines 1000, and the plurality of touch signal lines 1000 may include a plurality of first touch signal lines and a plurality of second touch signal lines. The plurality of first touch signal lines are electrically connected to the plurality of touch sensing electrodes 501 in one-to-one correspondence, and the plurality of first touch signal lines are electrically connected to the plurality of first touch signal leads in one-to-one correspondence. As a result, according to the touch chip in the display device as manufactured with the display panel 000, a touch signal may be applied to each column of touch sensing electrodes 501 via the first touch signal lead and the first touch signal line. The plurality of second touch signal lines are electrically connected to the plural rows of touch driving electrodes 502 in one-to-one correspondence, and the plurality of second touch signal lines are electrically connected to the plurality of second touch signal leads in one-to-one correspondence. As a result, according to the touch chip in the display device as manufactured with the display panel 000, a touch signal may be applied to each row of touch driving electrodes 502 via the second touch signal lead and the second touch signal line.

In some embodiments, as shown in FIG. 4, two first power signal leads 401 and two second power signal leads 402 may be provided. The two second power signal leads 402 are disposed between the two first power signal leads 401. The display panel 000 may further include: a plurality of driving signal lines (not shown in the figures) disposed within the display region 100*a*, and a plurality of driving signal leads (not shown in the figures) disposed within the non-display region 100*b*. The plurality of driving signal lines are connected to the plurality of driving signal leads as disposed between the two first power signal leads 400 in one-to-one correspondence. The plurality of driving signal leads are disposed in a fan-out region 100*c*.

Meanwhile, the plurality of driving signal lines are disposed on a side of the cathode proximate to the substrate 100, and the plurality of driving signal leads are disposed on a side of the first power signal lead 401 proximate to the substrate 100. As a result, the cathode can prevent crosstalk between the signals loaded on the driving signal line and the signals loaded on the touch unit 500 and touch signal line 1000. The first power signal lead 401 may prevent crosstalk between the signals loaded on the driving signal lead and the signals loaded on the touch signal lead 600.

In some embodiments, the first power signal lead 401, the power connecting bus 403 and the second power signal lead 402 are disposed on a same layer, and are made of a same material, such that the first power signal lead 401, the power connecting bus 403 and the second power signal lead 402 may be formed by a same one-time patterning process. The first power signal lead 401 and the driving signal lead are disposed on different layers, and the driving signal lead is disposed on a side of the first power signal lead 401 proximate to the substrate 100.

In embodiments of the present disclosure, at least one retaining wall 300 in the display panel 000 is arranged around the display region 100*a*, and the retaining wall 300 may be a ring-shaped retaining wall. As shown in FIG. 5, each retaining wall 300 may include at least two organic insulating layers that are laminated. The display panel 000 may further include a third conductive layer 1100 disposed between two adjacent organic insulating layers in the at least one retaining wall 300, and the third conductive layer 1100 may include a signal trace 400.

In the display panel 000, the packaging layer 200 may be configured to encapsulate the light-emitting device in the display panel 000 and isolate the light-emitting device from the outside air, thereby preventing the light-emitting layer in the light-emitting device from being eroded by, for example, moisture and oxygen in the air. The packaging layer 200 may include a first inorganic packaging layer, an organic packaging layer, and a second inorganic packaging layer that are laminated. The at least one retaining wall 300 may be configured to block the organic packaging layer in the packaging layer 200, such that the orthographic projection of the organic packaging layer in the packaging layer 200 on the substrate is within the display region 100*a*. As a result, the organic packaging layer in the packaging layer 200 is less likely to absorb moisture in the non-display region 100*b*, thereby reducing the possibility to affect the packaging effect of the packaging layer 200.

In some embodiments, as shown in FIGS. 4 and 5, the at least one retaining wall 300 may include a first retaining wall 301 and a second retaining wall 302. The second retaining wall 302 is proximate to the display region 100*a* relative to the first retaining wall 301. The at least two organic insulating layers in the first retaining wall 301 may include a first organic insulating layer 300*a*, a second organic insulating layer 300*b*, and a pixel defining layer 300*c* that are laminated. The at least two organic insulating layers in the second retaining wall 302 may include a second organic insulating layer 300*b* and a pixel defining layer 300*c*. As a result, the height of the first retaining wall 301 may be greater than the second retaining wall 302, and is disposed distal from the display region 100*a* relative to the second retaining wall 302. Therefore, in the case that the second retaining wall 302 fails to completely block the organic packaging layer in the packaging layer 200, the first retaining wall 301 may further block the organic packaging layer in the packaging layer 200, thereby improving the reliability of the packaging layer 200.

In the present disclosure, the third conductive layer 1100 is disposed between the first organic insulating layer 300*a* and the second organic insulating layer 300*b*. Moreover, the orthographic projection of the aperture 400*a* on the substrate 100 is within the orthographic projection of the first retaining wall 301 on the substrate 100. At the first retaining wall 301, a first organic insulating layer 300*a* which is prone to absorb water is provided under the third conductive layer 1100. Therefore, in the case that the orthographic projection of the aperture 400*a* in the signal trace 400 on the substrate 100 is within the orthographic projection of the first retaining wall 301 on the substrate 100, the aperture 400*a* can release the moisture absorbed by the first organic insulating layer 300*a* in the first retaining wall 301, thereby ensuring the flatness of the signal trace 400.

In an exemplary embodiment, the orthographic projection of the first power signal lead 401 in the signal trace 400 on the substrate 100 includes a first overlap region with the orthographic projections of the first retaining wall 301 and the second retaining wall 302 on the substrate 100. In this case, the orthographic projection of the aperture 400*a* in the first power signal lead 401 on the substrate 100 is within the first overlap region. The orthographic projection of the second power signal lead 402 in the signal trace 400 on the substrate 100 includes a second overlap region with the orthographic projection of the first retaining wall 301 on the substrate 100, and includes no overlap region with the orthographic projections of the second retaining wall 302 on the substrate 100. In this case, the orthographic projection of the aperture 400*a* in the second power signal lead 402 on the substrate 100 is within the second overlap region.

It should be further noted that, the power connecting bus 403 may be provided with no aperture 400*a* in the case that the orthographic projection of the power connecting bus 403 in the signal trace 400 on the substrate 100, as shown in FIG. 4, includes no overlap region with the orthographic projection of the first retaining wall 301 on the substrate 100.

In some embodiments, the display panel 000 may further include an optical adhesive 1200. The optical adhesive 1200 is disposed on a side of the second conductive layer 900 distal from the substrate 100, and configured to bond the display panel 000 to a glass cover.

It should be noted that, the one-time patterning process in the embodiments of the present disclosure may include photoresist coating, exposure, development, etching, and photoresist stripping.

In summary, the display panel according to embodiments of the present disclosure includes a substrate, a light-emitting device, a packaging layer, at least one retaining wall, and a signal trace. In the display panel, the signal trace is provided with an aperture, and an orthographic projection of the aperture on the substrate is within an orthographic projection of the at least one retaining wall in the display panel on the substrate. Therefore, at the at least one retaining wall, the moisture absorbed by an organic film layer as disposed on a side of the signal trace proximate to the substrate is released via the aperture, such that the flatness of the signal trace is ensured, and the impact on electrical signals loaded on the signal trace is reduced. In this way, the display effect of the display panel is improved.

Embodiments of the present disclosure further provide a method for manufacturing a display panel. The method for manufacturing the display panel aims to manufacture the display panel shown in FIG. 1, and may include the following processes.

In process A, a substrate is provided. The substrate includes a display region, and a non-display region disposed on an outer periphery of the display region.

In process B, a light-emitting device, a packaging layer, at least one retaining wall, and a signal trace are formed on the substrate.

The light-emitting device is disposed within the display region, and the at least one retaining wall and the signal trace are disposed within the non-display region. The signal trace is electrically connected to the light-emitting device, and is provided with an aperture. An orthographic projection of the aperture on the substrate is within an orthographic projection of the at least one retaining wall on the substrate.

Those skilled in the art may clearly understand that the specific working principle of the display panel described above may see the corresponding contents in the aforesaid structural embodiments for the display panel, and details are not to be described herein again for convenience and brevity of the description.

In summary, according to the method for manufacturing the display panel provided by embodiments of the present disclosure, the signal trace in the display panel is provided with an aperture, and an orthographic projection of the aperture on the substrate is within an orthographic projection of the at least one retaining wall of the display panel on the substrate. Therefore, at the at least one retaining wall, the moisture absorbed by an organic film layer as disposed on a side of the signal trace proximate to the substrate is released via the aperture, such that the flatness of the signal trace is ensured, the impact on electrical signals loaded on the signal trace is reduced. In this way, the display effect of the display panel is improved.

Figure 7:
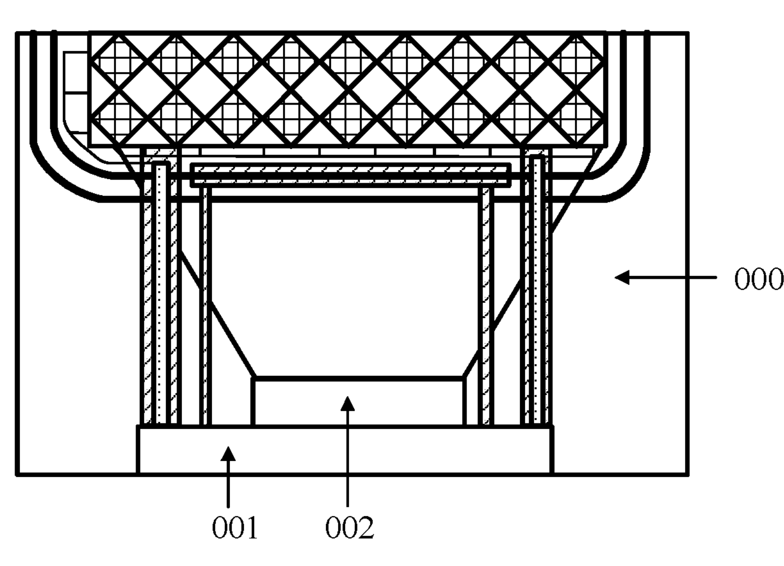
FIG. 7 is a schematic structural diagram of a display device according to an embodiment of the present disclosure.

Embodiments of the present disclosure further provide a display device. The display device may be any product or component having a display function, such as a mobile phone, a tablet computer, a TV set, a display, a notebook computer, a digital photo frame, a navigator etc. In an exemplary embodiment, as shown in FIG. 7, FIG. 7 is a schematic structural diagram of a display device according to an embodiment of the present disclosure, and display device 010 may include a display panel 000, and a flexible circuit board 001 encapsulated with a driving chip 002. The display panel 000 may be the display panel in the aforesaid embodiments. The driving chip 002 is electrically connected to the signal trace in the display panel 000, and may further be electrically connected to the driving signal lead in the display panel 000.

In some embodiments, the flexible circuit board 001 may also be encapsulated with a touch chip that is electrically connected to the touch signal lead in the display panel 000.

It should be noted that, the dimensions of the layers and regions in the accompanying drawings may be exaggerated for clarity of illustration. It should be understood that when a component or layer is referred to as being "on" another component or layer, it may be directly disposed on the another component, or there may be an intermediate layer. Further, it should be understood that, when a component or layer is referred to as being "under" another component or layer, it may be directly disposed under the another component, or there may be more than one intermediate layer or component. It should also be understood that, when a layer or component is referred to as being "between" two layers or components, it may be the only layer between the two layers or components, or there may be more than one intermediate layer or component. Similar reference signs in this specification indicate similar components.

In the present disclosure, the terms such as "first" and "second" are merely for descriptive purpose, and cannot be understood as indicating or implying a relative importance. The term "a plurality of" means two or more in number, unless otherwise defined.

Described above are merely optional embodiments of the present disclosure, and are not intended to limit the present disclosure. Any modifications, equivalent substitutions, improvements, and the like within the spirit and principles of the present disclosure, are not beyond the protection scope of the present disclosure.

What is claimed is:

1. A display panel, comprising:

a substrate, comprising a display region and a non-display region disposed on an outer periphery of the display region;

a light-emitting device and a packaging layer, disposed on the substrate; and at least one retaining wall and a signal trace, disposed on a side of the packaging layer proximate to the substrate;

wherein the light-emitting device is disposed within the display region, the at least one retaining wall and the signal trace are disposed within the non-display region, and the signal trace is electrically connected to the light-emitting device and is provided with at least one aperture, wherein an orthographic projection of the at least one aperture on the substrate is disposed within an orthographic projection of the at least one retaining wall on the substrate; and wherein each of the at least one retaining wall comprises at least two organic insulating layers that are laminated, the display panel further comprises a third conductive layer between two adjacent organic insulating layers in the at least one retaining wall, and the third conductive layer comprises the signal trace;

wherein the at least one retaining wall comprises a first retaining wall and a second retaining wall, and at least two organic insulating layers in the first retaining wall comprise a first organic insulating layer, a second organic insulating layer and a pixel defining layer that are laminated; and wherein the third conductive layer is disposed between the first organic insulating layer and the second organic insulating layer, and the orthographic projection of the at least one aperture on the substrate is within an orthographic projection of the first retaining wall on the substrate so as to release the moisture absorbed by the first organic insulating layer;

wherein the signal trace comprises at least one first power signal lead, two second power signal leads and a power connecting bus, wherein an extending direction of a length of the power connecting bus is parallel to an extending direction of a length of a part of the at least one retaining wall, the two second power signal leads are arranged at a same side of the power connecting bus and are arranged at two ends of the power connecting bus respectively along the extending direction of the length of the power connecting bus, and an extending direction of a length of each of the two second power signal leads is perpendicular to the extending direction of the length of the power connecting bus, wherein the power connecting bus and the two second power signal leads are all independent parts, and the power connecting bus is electrically connected to each of the two second power signal leads;

the at least one aperture is respectively disposed in the at least one first power signal lead, the two second power signal leads and the power connecting bus;

an orthographic projection of the at least one first power signal lead on the substrate comprises a first overlap region with the orthographic projection of the at least one retaining wall on the substrate, an orthographic projection of each of the two second power signal leads on the substrate comprises a second overlap region with the orthographic projection of the at least one retaining wall on the substrate, and an orthographic projection of the power connecting bus on the substrate comprises a third overlap region with the orthographic projection of the at least one retaining wall on the substrate; and the orthographic projection of the at least one aperture on the substrate is respectively disposed within the first overlap region, the second overlap region and the third overlap region.

2. The display panel according to claim 1, further comprising:

a touch unit and at least one touch signal lead, disposed on a side of the packaging layer distal from the substrate, wherein the at least one touch signal lead is connected to the touch unit;

wherein the touch unit is disposed within the display region, the at least one touch signal lead is disposed within the non-display region, and an orthographic projection of the at least one touch signal lead on the substrate is at least partially within the orthographic projection of the at least one first power signal lead on the substrate and is not overlapped with the orthographic projection of the at least one aperture on the substrate.

3. The display panel according to claim 2, wherein the at least one touch signal lead comprises a plurality of touch signal leads, and the at least one aperture is arranged between at least two adjacent touch signal leads of the plurality of touch signal leads.

4. The display panel according to claim 3, wherein the at least one aperture comprises a plurality of apertures and the plurality of apertures are arranged in the at least one first power signal lead, and the at least one aperture is arranged between any two adjacent touch signal leads of the plurality of touch signal leads.

5. The display panel according to claim 4, wherein a distance between any two adjacent touch signal leads is greater than a width of each of the plurality of apertures, and a width direction of each of the plurality of apertures is perpendicular to an extending direction of the touch signal lead.

6. The display panel according to claim 4, wherein the at least one first power signal lead comprises two first power signal leads; the plurality of touch signal leads are divided into two groups of touch signal leads, wherein the two first power signal leads correspond to the two groups of touch signal leads one by one, and an orthographic projection of each group of the touch signal leads on the substrate is at least partially within an orthographic projection of a corresponding first power signal lead on the substrate.

7. The display panel according to claim 6, wherein one of the two groups of touch signal leads comprises a plurality of first touch signal leads successively arranged, and other one of the two groups of touch signal leads comprises a plurality of second touch signal leads successively arranged; and the touch unit comprises a touch sensing electrode and a touch driving electrode, insulated from each other, wherein the first touch signal lead is connected to the touch sensing electrode, and the second touch signal lead is connected to the touch driving electrode.

8. The display panel according to claim 7, wherein the touch signal lead comprises a first sub-lead and a second sub-lead electrically connected to the first sub-lead, wherein the first sub-lead and the second sub-lead are disposed on different layers.

9. The display panel according to claim 8, wherein an orthographic projection of the first sub-lead on the substrate is overlapped with an orthographic projection of the second sub-lead on the substrate.

10. The display panel according to claim 8, further comprising:

a first conductive layer, an insulating layer, and a second conductive layer that are disposed on the packaging layer and laminated in a direction perpendicular to and distal from the packaging layer;

wherein the first conductive layer comprises the first sub-lead, and the second conductive layer comprises the second sub-lead, the touch sensing electrode and the touch driving electrode.

11. The display panel according to claim 10, wherein a plurality of touch driving electrodes are arranged in a plurality of rows; and a plurality of touch sensing electrodes are arranged in a plurality of columns.

12. The display panel according to claim 2, further comprising:

a touch signal line configured to connect the touch unit and the touch signal lead.

13. The display panel according to claim 1, wherein the at least one first power signal lead comprises two first power signal leads, and the two second power signal leads are disposed between the two first power signal leads.

14. The display panel according to claim 13, wherein the at least one the first power signal lead, the power connecting bus and the two second power signal leads are disposed on a same layer and are made of a same material.

15. The display panel according to claim 1, wherein the second retaining wall is proximate to the display region relative to the first retaining wall; and at least two organic insulating layers in the second retaining wall comprise the second organic insulating layer and the pixel defining layer that are laminated.

16. A method for manufacturing a display panel, wherein the display panel is the display panel as defined in claim 1, the method comprising:

providing the substrate, wherein the substrate comprises the display region and the non-display region disposed on an outer periphery of the display region; and forming the light-emitting device, the packaging layer, at least one retaining wall, and the signal trace on the substrate.

17. A display device, comprising:

the display panel as defined in claim 1 and a driving chip;

wherein the driving chip is electrically connected to the signal trace in the display panel.

* * * * *